(12) United States Patent
McMorrow et al.

(10) Patent No.: US 7,260,367 B2
(45) Date of Patent: Aug. 21, 2007

(54) EDGE POWER DETECTOR/CONTROLLER

(75) Inventors: Robert J. McMorrow, Concord, MA (US); Eamon Nash, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 290 days.

(21) Appl. No.: 10/055,577

(22) Filed: Jan. 23, 2002

(65) Prior Publication Data
US 2003/0139153 A1 Jul. 24, 2003

(51) Int. Cl.
*H04B 1/02* (2006.01)
*H04B 17/00* (2006.01)

(52) U.S. Cl. .................... 455/108; 455/126; 455/115.1

(58) Field of Classification Search ................ 455/108, 455/126, 127.1, 115.1, 23, 24, 69, 71, 240.1, 455/102, 110; 330/125, 141, 75, 86, 105; 375/300, 302
See application file for complete search history.

(56) References Cited

U.S. PATENT DOCUMENTS

| | | | |
|---|---|---|---|
| 4,990,803 A | 2/1991 | Gilbert | |
| 5,193,223 A * | 3/1993 | Walczak et al. | ......... 455/115.1 |
| 5,287,555 A * | 2/1994 | Wilson et al. | ........... 455/115.1 |
| 5,408,197 A | 4/1995 | Miyake | |
| 5,590,408 A * | 12/1996 | Weiland et al. | ............... 455/69 |
| 5,655,220 A * | 8/1997 | Weiland et al. | ............... 455/69 |
| 5,826,177 A * | 10/1998 | Uno | .......................... 455/126 |
| 6,026,284 A * | 2/2000 | Seo | ......................... 455/115.1 |
| 6,118,988 A * | 9/2000 | Choi | ....................... 455/115.1 |
| 6,128,477 A * | 10/2000 | Freed | ...................... 455/115.1 |
| 6,370,358 B2 * | 4/2002 | Liimatainen | ............. 455/67.11 |
| 6,526,266 B1 * | 2/2003 | Obara | ........................ 455/126 |
| 7,085,544 B2 * | 8/2006 | Takano et al. | .............. 455/102 |

FOREIGN PATENT DOCUMENTS

| | | |
|---|---|---|
| EP | 0 535 669 A1 | 4/1993 |
| WO | WO99/39449 | 8/1999 |
| WO | WO99/67893 | 12/1999 |

* cited by examiner

*Primary Examiner*—Sonny Trinh
(74) *Attorney, Agent, or Firm*—Gauthier & Connors LLP (57) ABSTRACT

Described is a closed-loop power detector/controller for wireless systems employing a non-constant amplitude envelope modulation scheme. Any AM component in the feedback signal resulting from non-constant amplitude envelope signals is eliminated via feed-forward cancellation of the envelope signal. Generally, a signal representative of the AM variation in the non-constant amplitude envelope signals prior to amplification is obtained. This AM variation signal is then used to cancel any AM component in the feedback signal resulting from the non-constant envelope to create a power amplifier control signal without any AM variation, only the desired ramp profile.

33 Claims, 12 Drawing Sheets

EDGE POWER DETECTOR/CONTROLLER

BACKGROUND OF THE INVENTION

The invention relates to the field of RF power detectors and controllers, and in particular to RF power detectors and controllers used in mobile handset terminals for wireless applications.

The rollout of the new 2.5 and 3G wireless systems presents unique challenges to mobile handset designers. In order to reap the full benefit of expanded capacity and data bandwidth, the new handsets must work on both the new systems as well as the old. One of these new systems is the so-called Enhanced Data Rates for Global Evolution (EDGE). The EDGE standard is an extension of the Global System for Mobile Communications (GSM) standard.

EDGE increases the data rate over that available with GSM by sending more bits per RF burst. More bits are sent in EDGE by using a modulation scheme based on 8-phase shift keying (8-PSK), which provides an increase over GSM's Gaussian minimum shift keying (GMSK) modulation format. In the EDGE modulation scheme, the 8-PSK constellation is rotated $3\pi/8$ radians every symbol period to avoid the problems associated with zero crossings. In contrast to GMSK's constant amplitude envelope, the added rotation factor in the EDGE modulation scheme results in a non-constant amplitude envelope. This non-constant amplitude envelope presents some difficulties with regard to RF power control. These problems are exacerbated by the desire to have one transmitter that can be used for both the GSM and EDGE standards.

Figure 1:
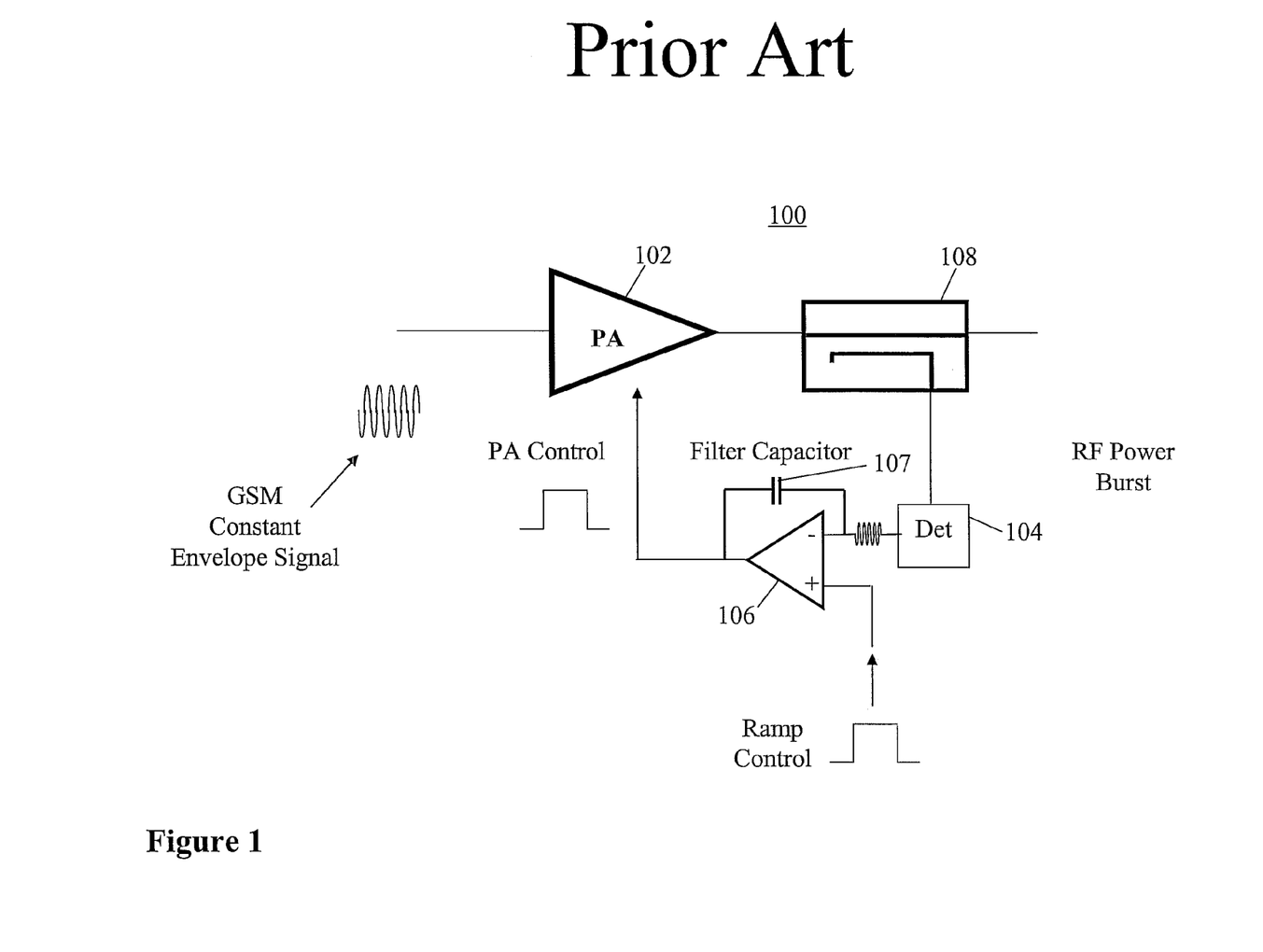
FIG. 1 shows a prior art power measurement and control system for GSM systems.
Figure 2:
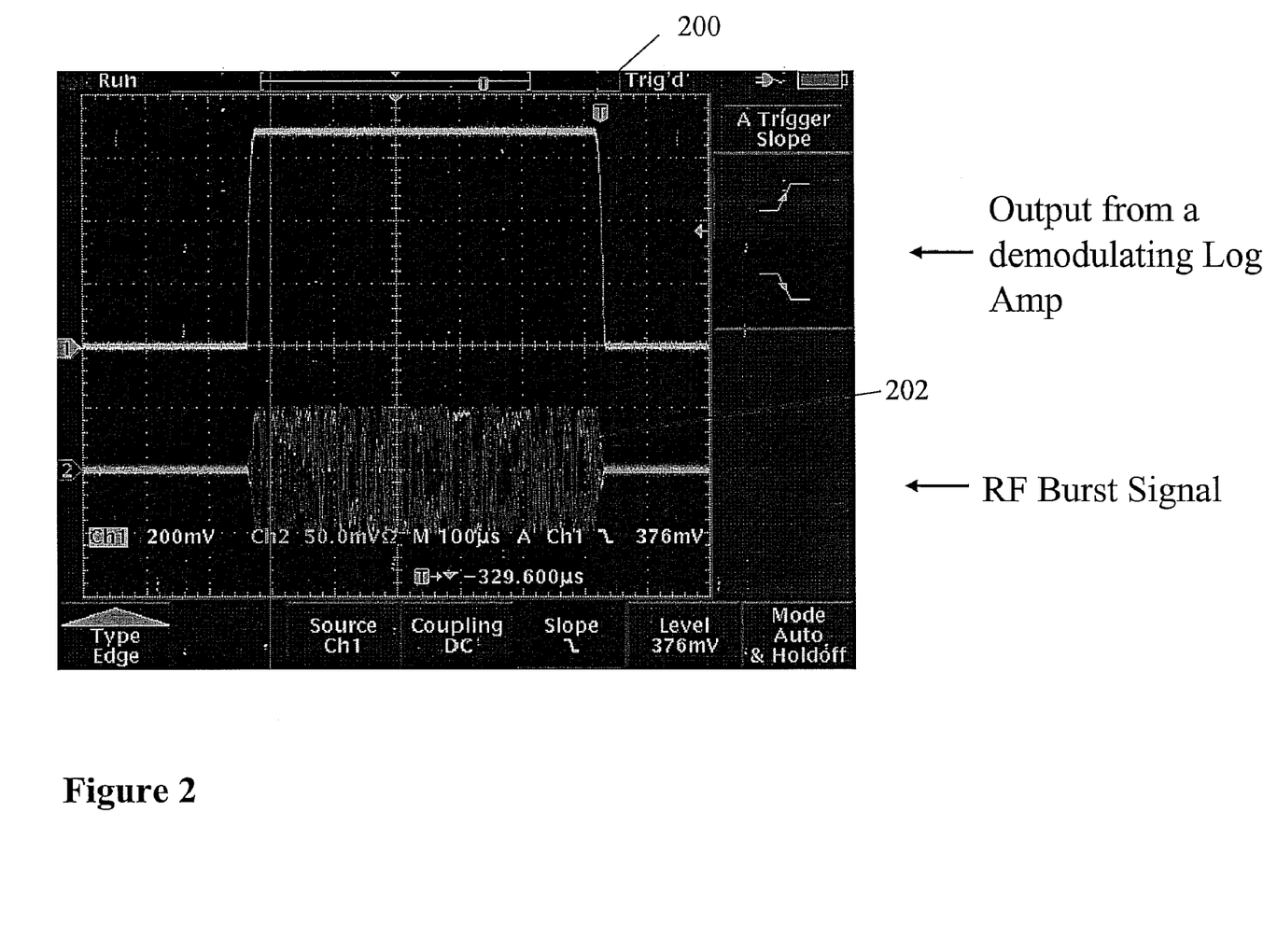
FIG. 2 shows the output of a demodulating log-amp with a GSM signal applied.

FIG. 1 shows a prior art power detection and control system 100 for GSM systems. GSM constant envelope signals are input to and amplified by a power amplifier (PA) 102. Signals output by power amplifier 102 are coupled by a directional coupler 108 into some form of demodulating detector 104, typically a logarithmic amplifier (log amp), which translates the power of the output signals into a voltage. FIG. 2 shows the output 200 of demodulating log amp 104 when a GSM signal 202 is applied at the input. As shown in FIG. 2, the voltage 200 output by log amp 104 is a DC voltage because GSM signals have a constant amplitude envelope. The DC output of log amp 104 is then compared to a ramp control signal using a high gain, frequency limited differential amplifier 106. Based upon the comparison, differential amplifier 106 outputs an error signal, which is filtered by a filter capacitor 107 (amplifier 102 is configured as an integrator) to create a PA ramp voltage that is used to control the power output of PA 102. This creates a closed loop system that will set the output power to a level defined by the ramp control signal. The system is defined by the power control slope in dB/V and the 0V intercept point in dBm. The frequency response of this closed loop system must be fast enough to provide an adequate rise time, and slow enough to avoid ringing or instability.

Figure 3:
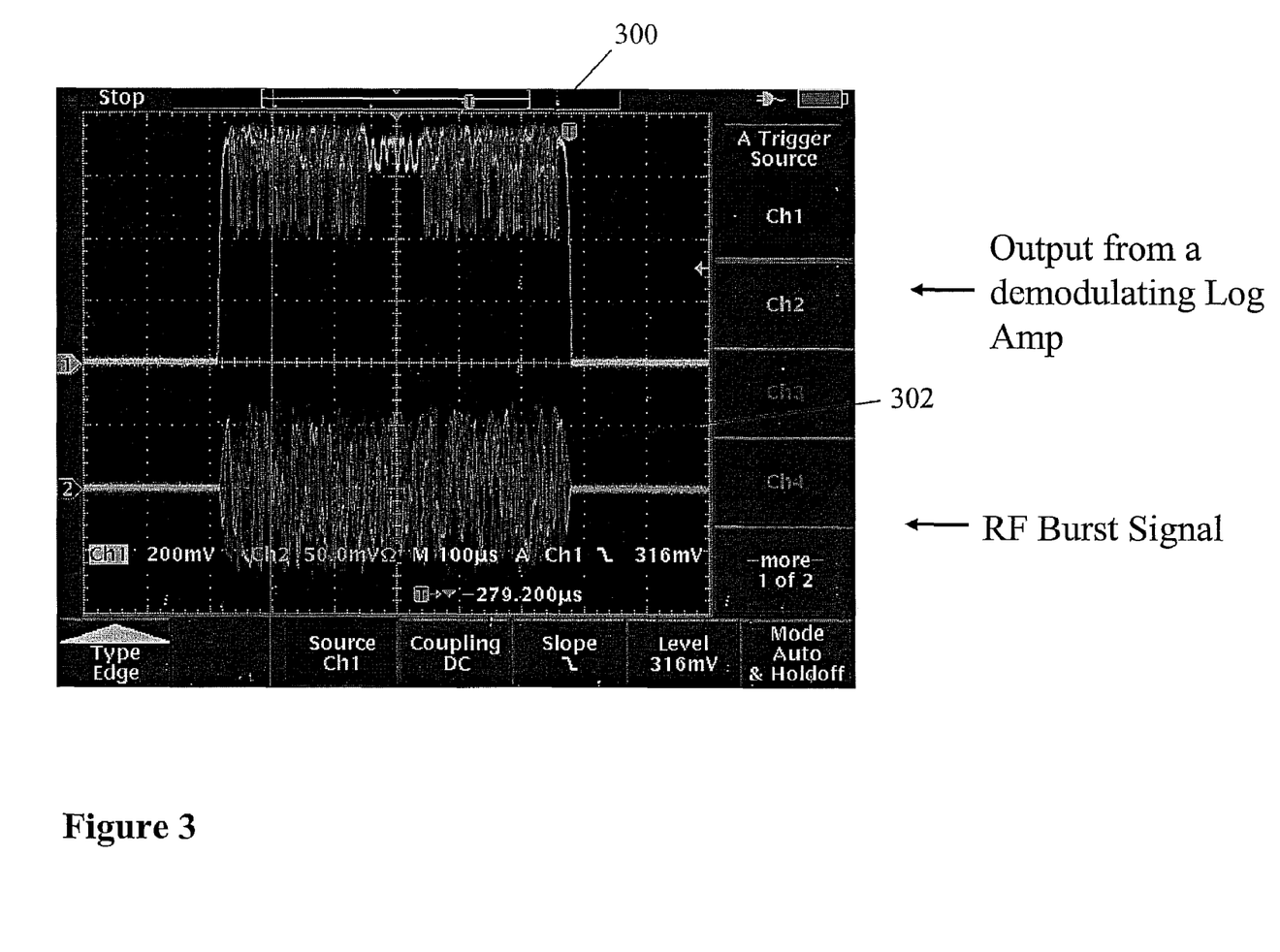
FIG. 3 shows the output of a demodulating log-amp with an EDGE signal applied.

Some unique problems arise when an EDGE signal having a non-constant amplitude envelope is applied to the GSM control loop 100. The EDGE system standard requires that PA 102 ramp up and down with the same speed as for GSM (28uS). Thus, the loop must have a response faster than 35 kHz. However, unlike the GSM signal, the EDGE signal contains an AM component resulting from the non-constant amplitude envelope. Logarithmic amplifier 104 will detect this modulation and vary the output DC voltage accordingly. This is illustrated in FIG. 3, which shows the output 300 of demodulating log amp 104 when an EDGE signal 302 is applied at the input. As shown in FIG. 3, the voltage 300 output by demodulating log amp 104 has a voltage ripple component that results from the non-constant amplitude envelope, in addition to the constant DC voltage component. The resulting voltage ripple results in as much as a 20 dB variation in amplitude. Because the DC voltage is varied according to the AM component, the negative feedback of the closed loop system will work to eliminate the AM information in the EDGE signal.

Several methods for solving this problem have been proposed. First, two different filters could be used. A fast filter is used for the power ramping section of the signal, and a second, slower filter is switched in when the AM modulation begins. This solution will still allow some AM variation to leak into the loop since the filter will require some amount of time to create an average and settle. Another approach is to remove the second filter and simply hold the DC To voltage constant during the AM modulation phase. This track and hold function will not have the same problem with settling time and no AM ripple will leak into the loop. However, the system will be running open-loop while the hold function is engaged. Thus, no corrections can be made to the PA output power during the RF burst to compensate for external influences (battery fluctuations, temperature, etc.). The finite nature of the data is another problem. Only 102 symbols of data are transmitted per frame. This small sample size means that there will be variations in the number and type of phase transitions per frame thus changing the peak to average ratio of the signal and the resulting average power per frame. An open loop system will not be able to adjust for these variations.

SUMMARY OF THE INVENTION

The present invention provides a power detector/controller for signals having modulation scheme with a non-constant amplitude envelope. The power detector/controller comprises a power amplifier, an output demodulating detector and a summing junction. The power amplifier has an input to receive an input signal with non-constant amplitude envelope and an output to output an amplified input signal. A power amplifier control signal controls either output power or gain of the power amplifier. The output demodulating detector is coupled to the output of the power amplifier to generate a feedback signal proportional to the amplified input signal's power. The feedback signal includes an AM variation due to the non-constant amplitude envelope. The summing junction receives the feedback signal, a ramp control signal that indicates either a target gain or target output power of the power amplifier, and an AM variation signal that represents the AM variation in the power of the input signal due to the non-constant amplitude envelope. The summing junction combines the feedback signal, the ramp control signal and AM variation signal to produce the power amplifier control signal such that the power amplifier control signal substantially free of any AM variation due to the non-constant envelope.

DETAILED DESCRIPTION OF THE INVENTION

The present invention provides a closed-loop power detector/controller for wireless systems employing a non-constant amplitude envelope modulation scheme. Any AM component in the closed loop feedback signal is eliminated via feed-forward cancellation of the envelope signal. Generally, a signal representative of the AM variation in the non-constant amplitude envelope signals prior to amplification is obtained. This AM variation signal is then used to cancel any AM component in the feedback signal resulting from the non-constant envelope so that a PA control signal that has no AM component, only the desired ramp profile, can be created.

In addition to setting the output power, this control circuit also improves the linearity of the PA. Some amplitude distortion may be present due to non-linearities present in the PA. The difference between the input AM component and the output AM component is known as the amplitude distortion. Even though the AM component in the feedback signal due to a non-constant envelope is cancelled by feedforward, this amplitude distortion is not, and is therefore introduced as negative feedback at the PA. Thus, the corrective signal to the PA will respond to the amplitude distortion, resulting in some degree of improvement in the linearity of the PA. This side benefit of the detector can be further exploited by those familiar with polar loop feedback systems to create a highly linear amplifier from otherwise saturated, or non-linear amplifiers. However, even if this residual AM ripple is not further exploited for linearization, its presence will not interfere with the operation of the closed loop power control.

Figure 4:
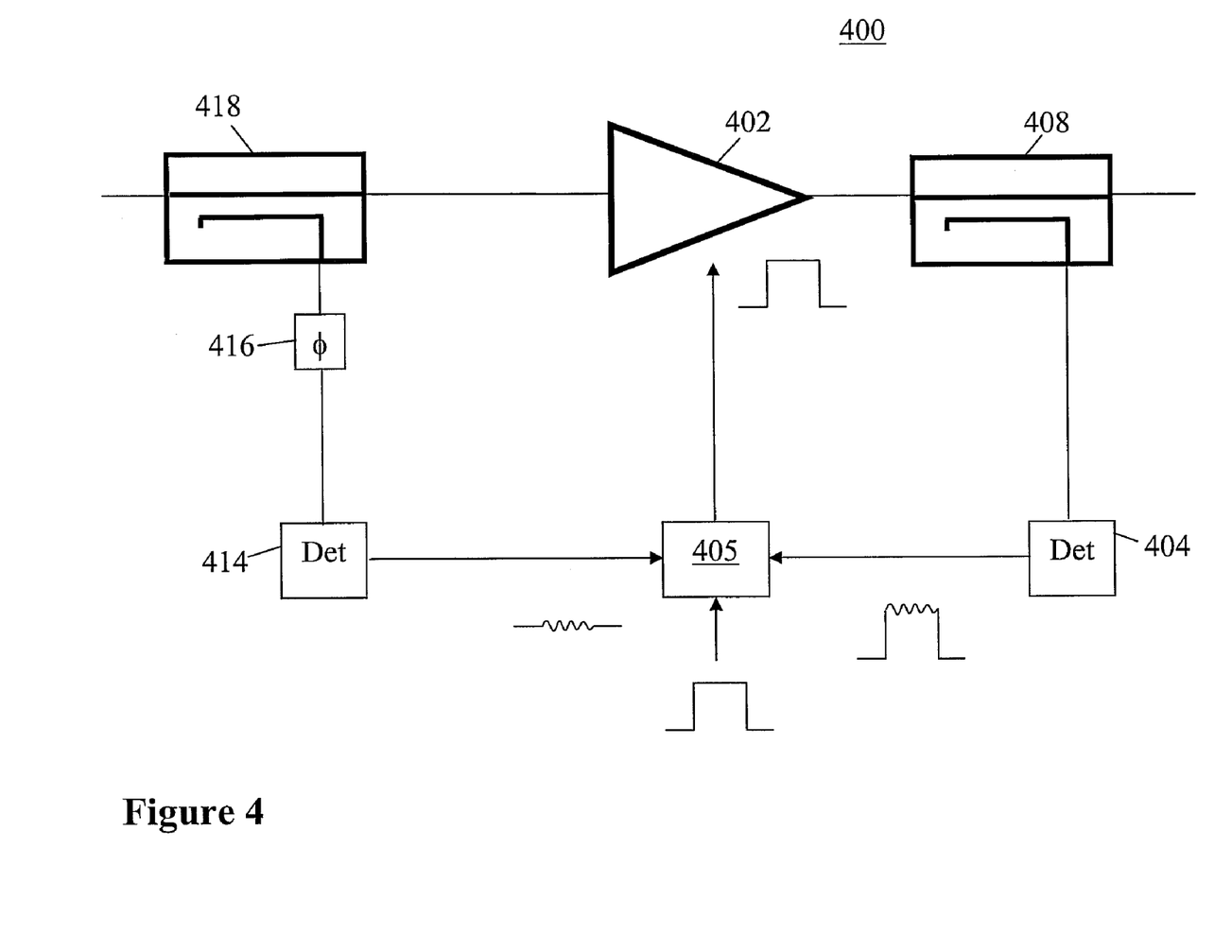
FIG. 4 conceptually illustrates a power detector/controller according to the present invention.

A power detector/controller 400 according to the present invention is conceptually illustrated in FIG. 4. As shown in FIG. 4, a PA 402 amplifies input RF signals. PA 402 is either a gain controlled PA or a power controlled PA. When PA 402 is a power controlled PA, its output power is controlled by a control signal, $V_{apc}$. When it is a gain controlled PA, its gain is controlled by the control signal $V_{apc}$.

An output coupler 408 couples a portion of the output RF signal to an output demodulating detector 404. Demodulating detector 404 translates the coupled output RF signal into a feedback signal proportional to the power in the RF output signal. This feedback signal is output to summing junction 405.

Summing junction 405 also receives the ramp control signal. The ramp control signal is proportional to either the target gain of PA 402 or the target output power of PA 402, depending upon whether PA 402 is power controlled or gain controlled. Any PA can be subject to gain control or power control depending on how the detectors are configured.

In addition to the feedback signal and ramp control signal, summing junction 405 receives an AM variation signal that represents the AM variation in the input signal power resulting from the non-constant envelope. Any envelope variation that is present on the detected signal at the output of PA 402 is also present on the input signal to the PA 402. Thus, by obtaining the AM variation in the input signal power, the AM variation can be cancelled from the feedback signal obtained from the output.

To obtain the AM variation of the input signal power, an input demodulating detector 414 is used. Input demodulating detector 414 and output demodulating detector 404 are balanced detectors. They can be logarithmic detectors or linear detectors. Input demodulating detector 418 receives a portion of the input RF signal from coupler 418 via phase shifter 416. Phase shifter 416 adds a delay to the coupled input signal so that the AM variation from the input signal is aligned with the AM variation from the output signal to ensure cancellation of the AM variation. Input demodulating detector 414 receives the delayed, coupled input signal and translates it into a signal proportional to the power in the input RF signal. Demodulating detector 414 outputs this AM variation signal to summing junction 405.

As an alternative to using an input demodulating detector 414 to obtain the AM variation, the AM variation signal is obtained directly from the base-band processor.

At summing junction 405, conditioning of the AM variation signal is performed, if needed for the control loop type (i.e., power or gain control). Conditioning circuitry in summing junction 405 removes the DC component from the AM variation signal depending upon whether gain or power is controlled. When power control is desired, the DC component is removed to effectuate a power control loop. When gain control is desired, the DC component is not removed. It should be noted that power control can also be effectuated without removal of the DC component, as will be further described below. To remove the DC component, the output of demodulating detector 414 is ac-coupled, or otherwise high-pass filtered.

Also, conditioning of the AM variation signal is performed at summing junction 405 if needed to ensure cancellation. For instance, if necessary to ensure cancellation, conditioning circuitry adjusts the amplitude of the AM variation in the output of demodulating detector 414. When balanced demodulating detectors 404 and 414 are logarithmic amplifiers, the amplitude of the AM variation output by both is substantially the same regardless of the gain of the PA. In this case, the amplitude does not need adjusting. However, when the demodulating detectors 404 and 414 are linear detectors then the amplitudes are not substantially the same and the amplitude of the AM variation in the signal output by demodulating detector 414 needs adjusted to ensure amplitude cancellation.

After any necessary conditioning, the conditioned AM variation signal, ramp control signal, and feedback signal are then combined in summing junction 405 so as to cancel any AM variation in the signals that results from the AM component in the input signals, and to produce an error signal, which is filtered to create a PA control signal, $V_{apc}$, that is used to control the output of PA 402. It should be noted that, in practice, it is difficult to achieve a perfect phase and amplitude match between the AM variation signal and the AM variation in the feedback signal for cancellation. However, it is not necessary for the match to be exact, and cancellation on the order of −10 dB is adequate.

It should also be noted that even though $V_{apc}$ is shown as a DC voltage, this is illustrative to indicate the AM variation has been removed. As a result of the filtering in practice, a ramped profile will actually result. The ramped profile typically takes the form of a raised cosine.

Advantageously, a power detector/controller according to the present invention supports not only non-constant envelope signals, such as those in EDGE, but also constant envelope signals, such as those in GSM. Hence, only a single power detector/ controller according to the present invention needs to be used in wireless handsets designed to operate on both GSM and EDGE systems.

Figure 5:
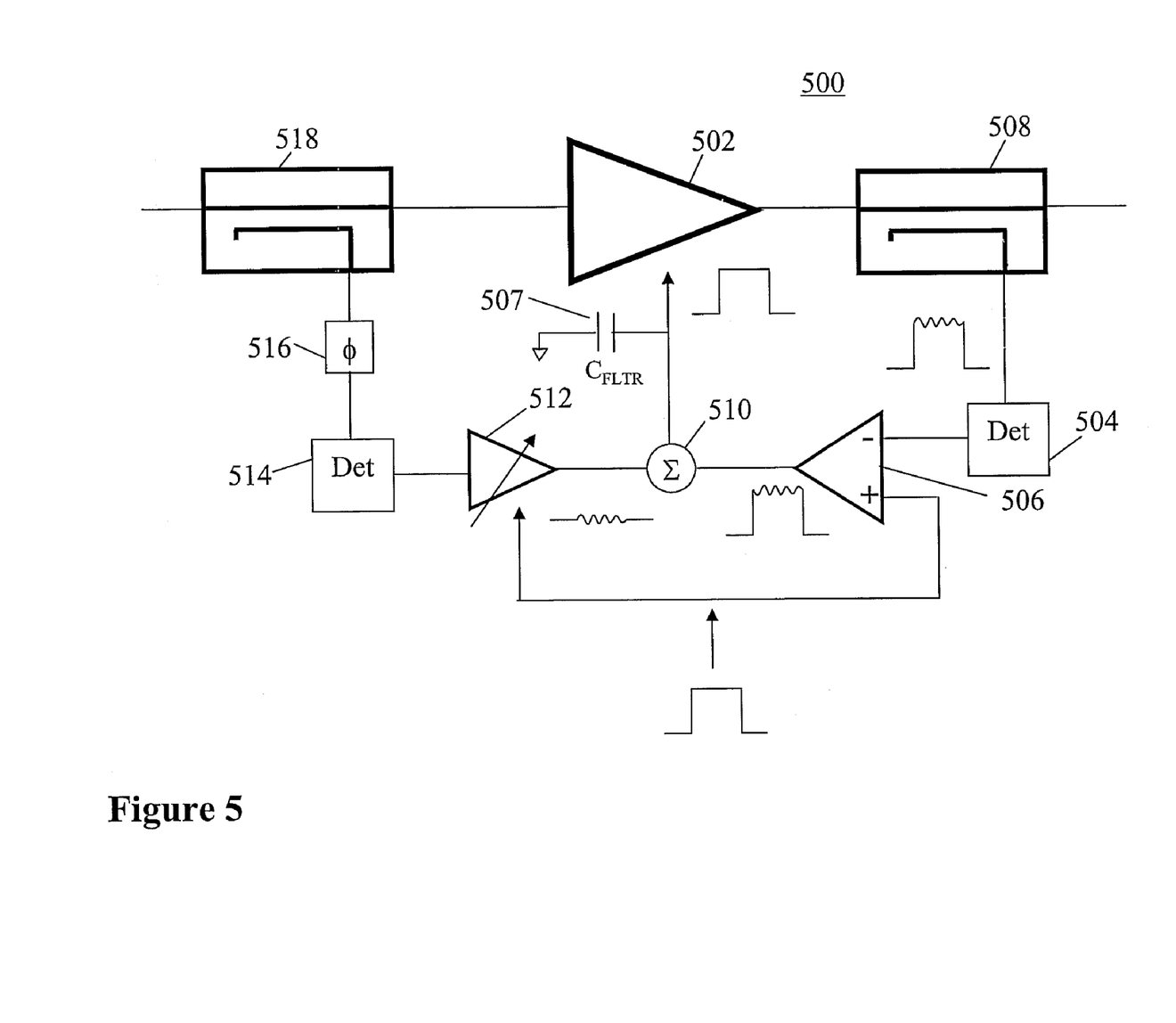
FIG. 5 illustrates one embodiment of a power detector/controller according to the present invention.

FIG. 5 illustrates an embodiment of a power detector/controller 500 according to the present invention in which the summing junction comprises a differential amplifier 506, a sum node 510, a filter capacitor 507, an ac-coupling capacitor (not shown), and a variable gain amplifier (VGA) 512. In this embodiment, demodulating detectors 514 and 504 are linear detectors.

The input and output of a PA 502 are respectively coupled to balance demodulating detectors 514 and 504 respectively. A directional coupler 518 couples the input-to-input demodulating detector 514 via a phase shifter 516. Phase shifter 516 adds a delay to the input signal to align the input and output signals so that an AM variation signal determined from the to input and a feedback signal determined from the output are aligned. A directional coupler 508 couples the output-to-output demodulating detector 504.

Demodulating detector 514 translates the power of the input signal into a voltage that includes any voltage ripple resulting when input signals have a non-constant amplitude envelope. While not shown, the output of input detector 514 is ac-coupled to VGA 512 with an ac-coupling capacitor to remove the DC component from the voltage. In this configuration, the circuit provides power control. However, if the initial, un-amplified DC component of the signal from detector 514 were preserved in the signal output by VGA 512, then the circuit would provide gain control. VGA 512 adjusts the amplitude of the ripple voltage according to the ramp control signal to ensure amplitude cancellation. The VGA 512 outputs the conditioned AM variation signal to sum node 510.

Similarly, output demodulating detector 504 translates the power of the output signal into a voltage that also includes any voltage ripple resulting when input signals have a non-constant amplitude envelope. This feedback voltage is input to the negative input of differential amplifier 506, while the ramp control signal is input to the positive input. The differential amplifier 506 outputs an error signal for controlling PA 502, which, however, still contains the voltage ripple due to the AM component.

The AM variation signal from VGA 512 is added to the error signal from differential amplifier 506 at sum node 510 to eliminate the voltage ripple from the error signal. Filter capacitor 507 filters the output of sum node 510, which results in a control signal, $V_{apc}$, with a ramped profile that controls the gain of PA 502.

Figure 6:
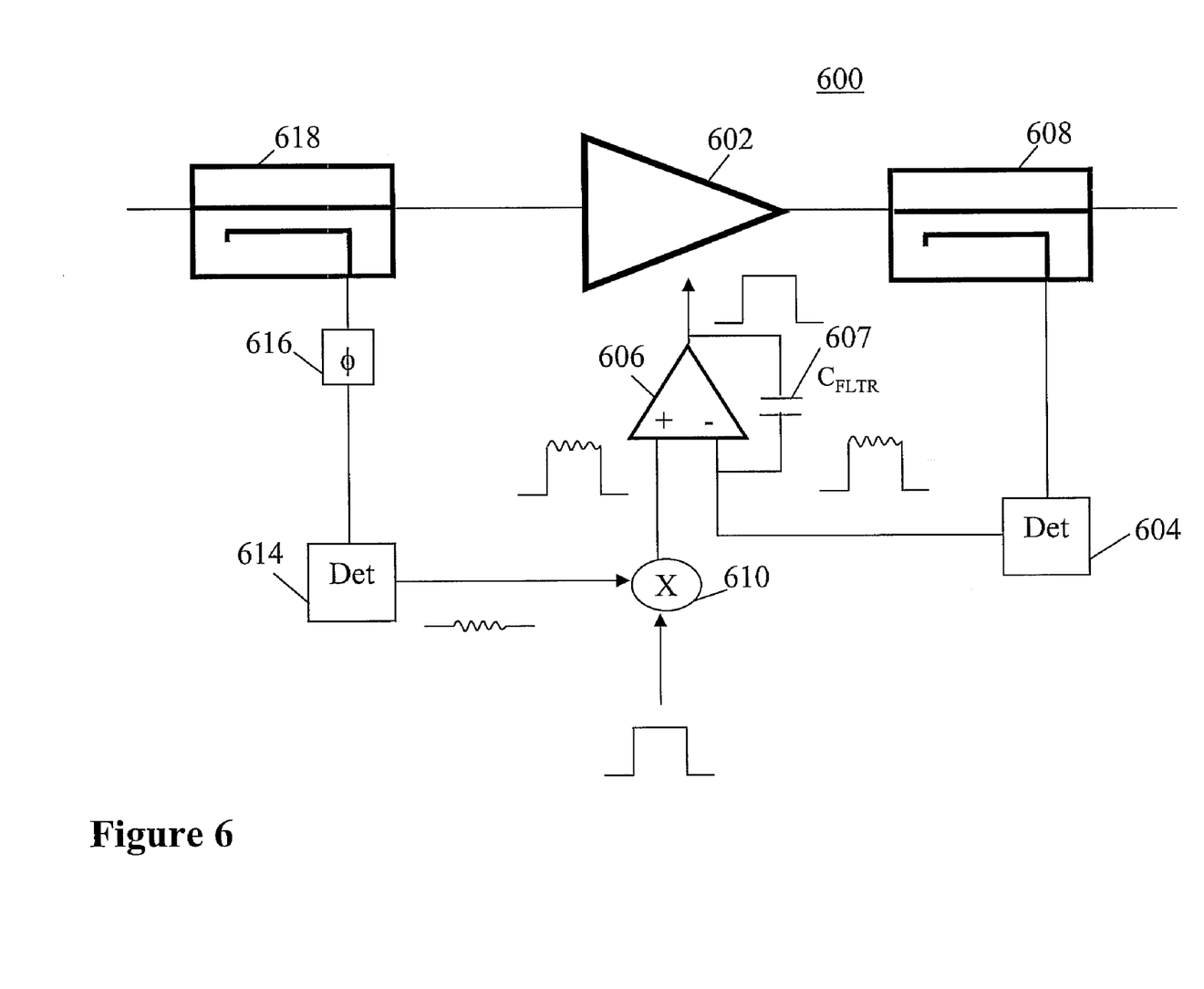
FIG. 6 shows another embodiment of a power detector/controller according to the present invention.

FIG. 6 shows another embodiment of a power detector/controller 600 according to the present invention in which the summing junction comprises a differential amplifier 606, a multiplication node 610, and a filter capacitor 607 and appropriate conditioning circuitry (not shown). In this embodiment, demodulating detectors 604 and 614 are linear detectors. The operation of this embodiment is essentially the same as that of FIG. 5, except, however, for where the AM variation is removed.

As shown, directional coupler 618 couples the input signal to input demodulating detector 614 via phase shifter 616, which delays the input signal to align it to the output signal, similar to the embodiment of FIG. 5. Input demodulating detector 614 translates the power of the input signal into a voltage that includes any voltage ripple resulting when input signals have a non-constant amplitude envelope. While not shown, as with the embodiment of FIG. 5, appropriate circuitry removes any DC component subsequent to input demodulating detector 614 and the amplitude of the ripple voltage is adjusted to ensure cancellation. The resulting signal is then combined with the ramp control voltage at multiplication node 610 to generate a composite ramp control/AM variation signal. This composite signal is provided to positive input of differential amplifier 606.

A directional coupler 608 couples the output of PA 602 to output demodulating detector 604. Output demodulating detector 604 translates the power of the output signal into a voltage that includes any voltage ripple resulting when input signals have a non-constant amplitude envelope. This signal is applied to the negative input of differential amplifier 606.

Differential amplifier 606 generates the PA control, $V_{apc}$, signal by subtracting the power signal output by output detector 604 from the composite ramp control/AM variation signal to generate an error signal without AM variation. Differential amplifier 606 is set up as an integrator with filter capacitor 607 to filter the error signal to produce a ramped profile, which is applied as the PA control, $V_{apc}$.

Figure 7:
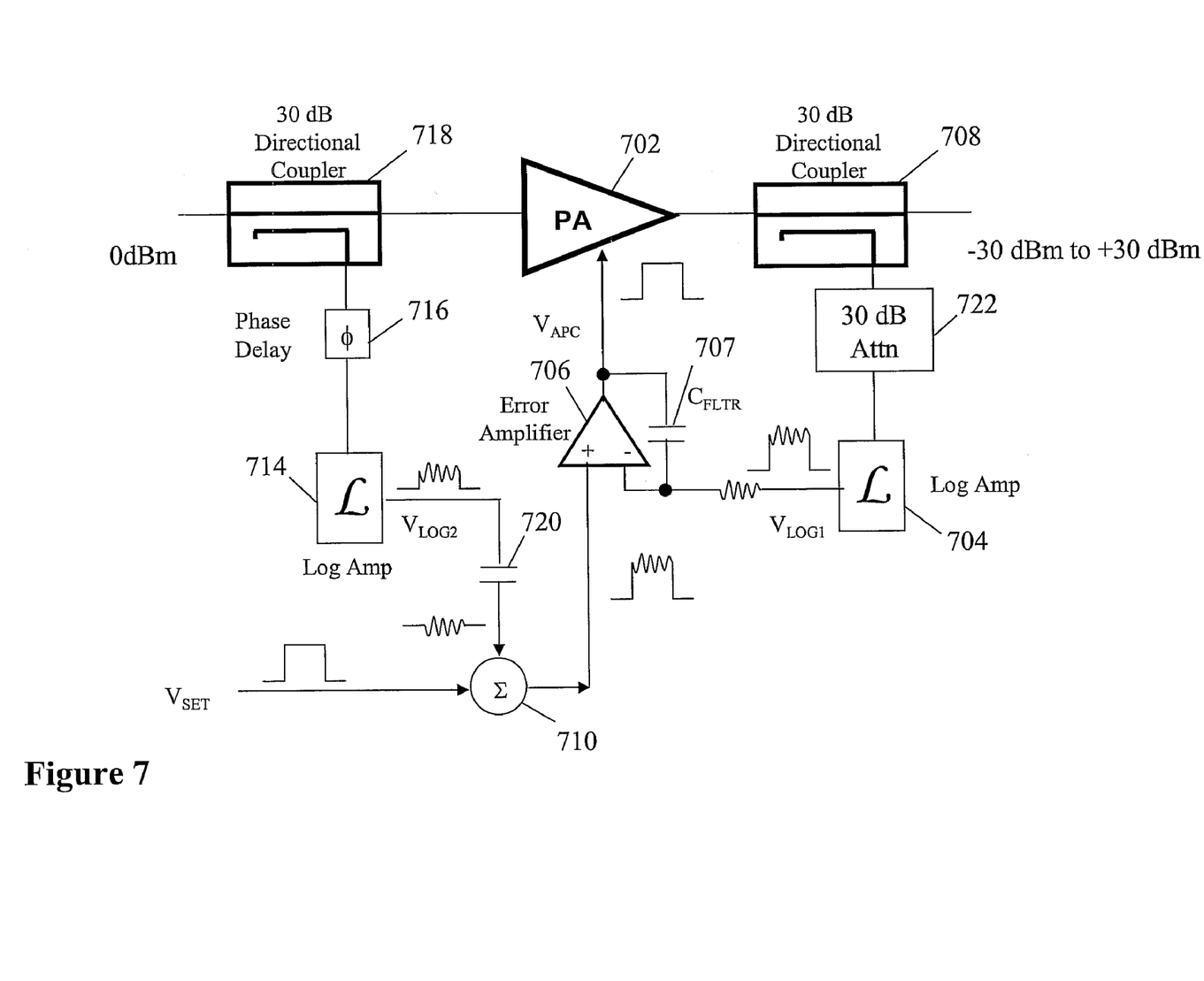
FIG. 7 illustrates another embodiment of a power detector/controller according to the present invention.

FIG. 7 illustrates another embodiment of a power detector/controller 700 according to the present invention in which the summing junction comprises a differential amplifier 706, a sum node 710, and a filter capacitor 707, and an ac-coupling capacitor 720. In this embodiment, demodulating detectors 714 and 704 are logarithmic amplifiers.

In the same manner as described above, a 30 dB directional coupler 718 couples the input signal to input log amp 714 via phase shifter 716, which delays the input signal to align it to the output signal. Input log amp 714 translates the power of the input signal into a voltage that includes any voltage ripple resulting when input signals have a non-constant amplitude envelope. The output of input log amp 714 is ac-coupled via capacitor 720 to remove its dc component. This signal is then added to the ramp control signal, $V_{SET}$, at summing node 710 to create a composite ramp control/AM variation signal. The composite signal is then applied to the positive input of differential amplifier 706, which is configured as a difference integrator.

A 30 dB directional coupler 708 couples the output to 30 dB attenuator 722, which attenuates the output signal before providing it to output log amp 704. While not necessary, when using balance logarithmic demodulating detectors, it is advantageous to use attenuator 722 to make the amplitudes of the signals input to demodulating detectors 716 and 722 similar in magnitude. Thus for example, when the maximum output power of PA 702 is 30 dB, a 30 dB attenuator is used for attenuator 722 to make the inputs similar in magnitude. Of course, other set points can be used, and, ideally, attenuator 722 would exactly attenuate the power of the signal from directional coupler 708 by the same amount that PA 702 is outputting.

Output log amp 704 translates the power of the output signal into a voltage that includes any voltage ripple resulting when input signals have a non-constant amplitude envelope. This signal is applied to the negative input of differential amplifier 706. Differential amplifier 706 then compares the composite signal to the output of log amp 704. Any differences in these signals will result in a corrective signal $V_{apc}$ being applied to the PA's $V_{apc}$ input.

Figure 8A:
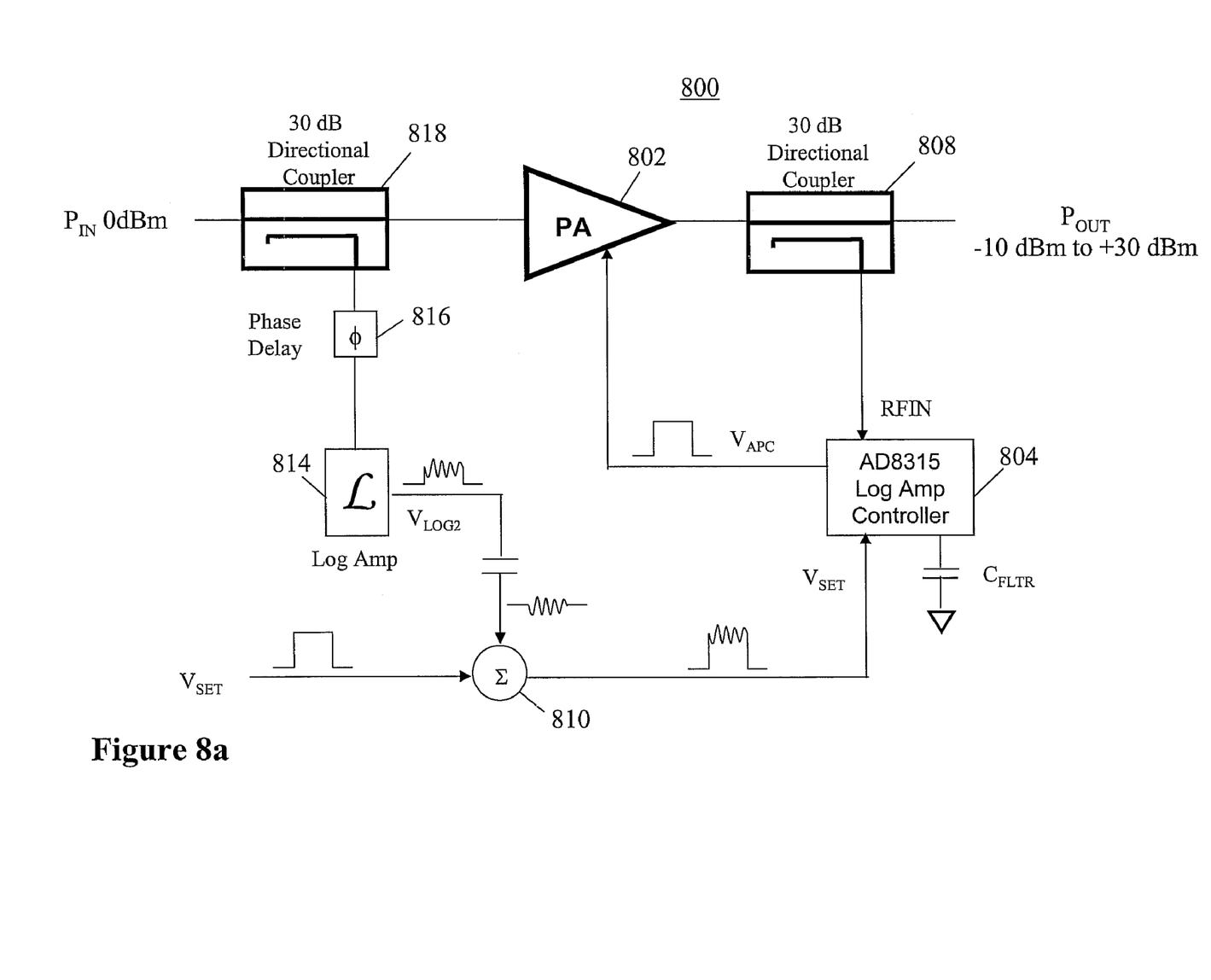
FIG. 8a illustrates an implementation of the embodiment shown in FIG. 7 using an AD8315 log amplifier/controller.
Figure 8B:
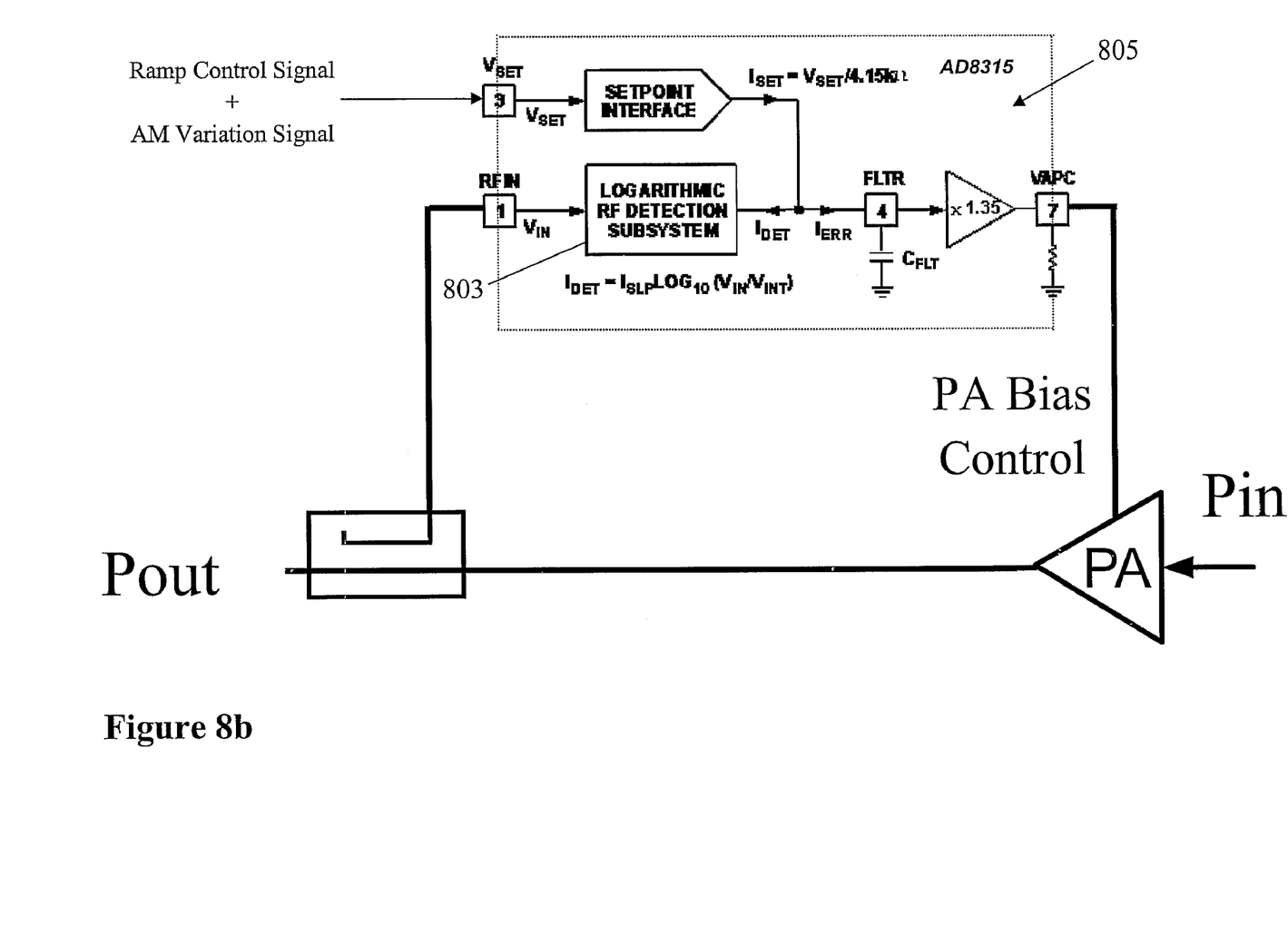
FIG. 8b illustrates a schematic of the AD8315 log amplifier/controller.

FIG. 8a illustrates an implementation of the embodiment shown in FIG. 7 using an AD8315 log amplifier/controller from Analog Devices. As shown in FIG. 8b, the AD8315 log amplifier/controller 804 incorporates a logarithmic amplifier RF detection subsystem and an error amplifier/integrator section 805. The AD8315 is, therefore, is used to implement output log amp 704 and amplifier/integrator 706. As shown in FIG. 8a, the sum of the ramp control signal, $V_{SET}$, and the ac-coupled signal from input log amp 814, is applied to the $V_{SET}$ input of the AD8315. The output of the AD8315 ($V_{apc}$) drives the $V_{apc}$ input of the PA.

Figure 9:
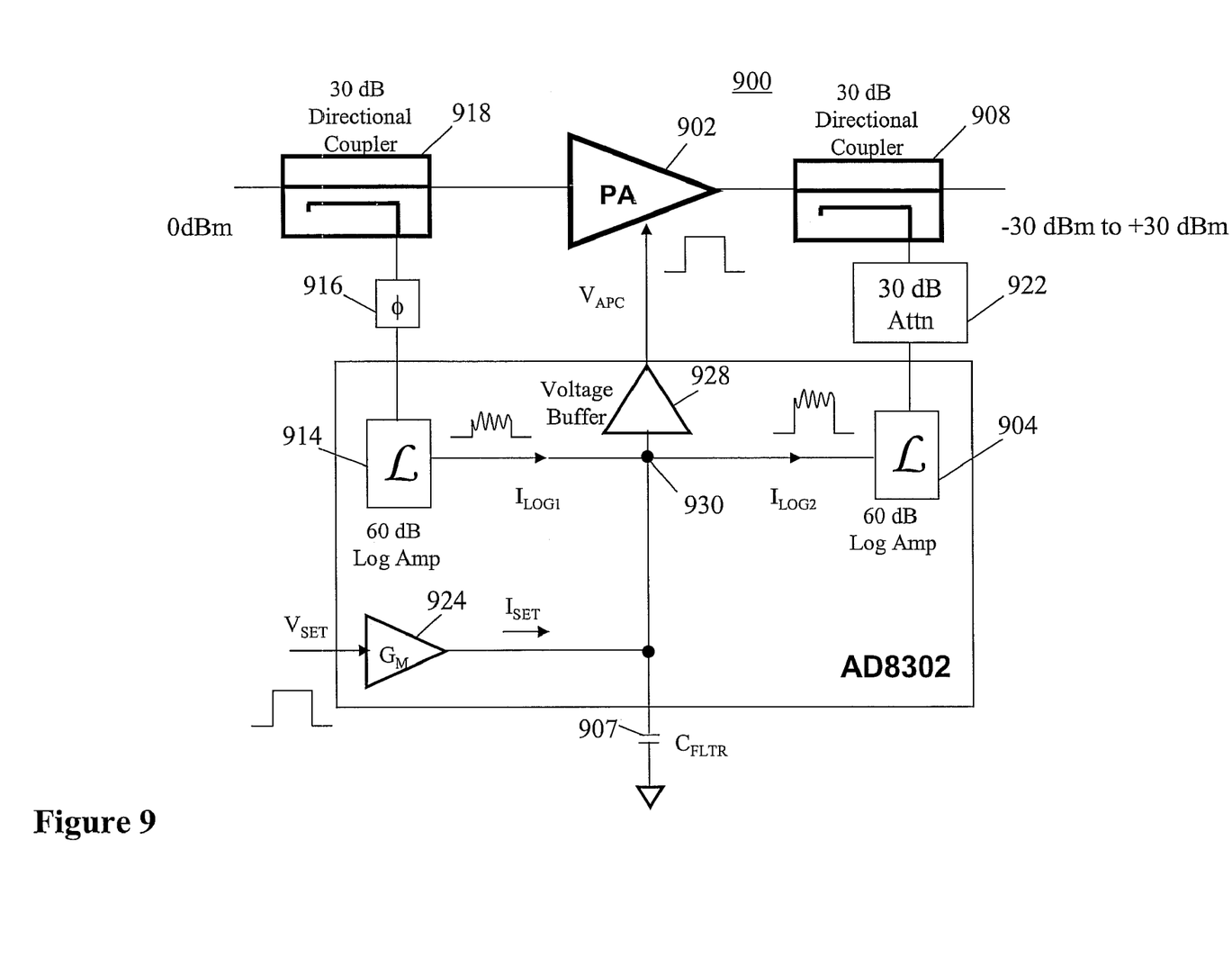
FIG. 9 illustrates an implementation of the embodiment shown in FIG. 7 using an AD8302.

The embodiment of FIG. 7 can also be implemented using an AD8302 Gain-Phase detector from Analog Devices. An AD8302 comprises two log amps and a sum node. FIG. 9 illustrates an implementation of the embodiment of FIG. 7 using an AD8302. The input signal to PA 902 and the output signal from PA 902 are sampled using 30 dB directional couplers 918 and 908, respectively. The coupled input signal is delayed by phase shifter 916 so as to align the AM variation in the input of PA 902 to the AM variation in the output of PA 902. The delayed input signal is provided from phase shifter 916 to input log amp 914 of AD8302 820. Log amp 914 translates the power of the delayed input signal into a current, $I_{log1}$, that includes any current ripple resulting when input signals have a non-constant amplitude envelope.

Attenuator 922 attenuates the coupled output signal by 30 dB to facilitate input signal balancing to the AD8302 920. The attenuated output signal is provided from attenuator 922 to output log amp 904 of AD8302 920. Log amp 904 translates the power of the attenuated output signal into a current, $I_{log2}$, that includes any current ripple resulting when input signals have a non-constant amplitude envelope.

The ramp control voltage, which corresponds to the desired gain of PA 902, is applied to the $V_{SET}$ input of AD8302 920. This voltage is converted to a current, $I_{Set}$, by a voltage-to-current converter 924 inside AD8302 920. This current, $I_{SET}$, is summed at node 930 with the currents, $I_{log1}$, and $I_{log2}$, from the input log amps 914 and 904. Node 930 sinks $I_{SET}$ and $I_{log1}$, while sourcing $I_{log2}$. This causes the simultaneous the subtraction of $I_{log2}$ (i.e., output power signal) from the sum of $I_{log1}$ and $I_{SET}$ (i.e., the AM variation and ramp control signal). This causes cancellation of the AM variation. Any residual error current at node 930 will either charge or discharge filter capacitor 907 which will either increase or decrease the voltage $V_{apc}$ signal output by voltage buffer 928 to PA 902. This embodiment results in the dB gain of PA 902 being proportional to the voltage of the $V_{SET}$ signal.

Figure 10:
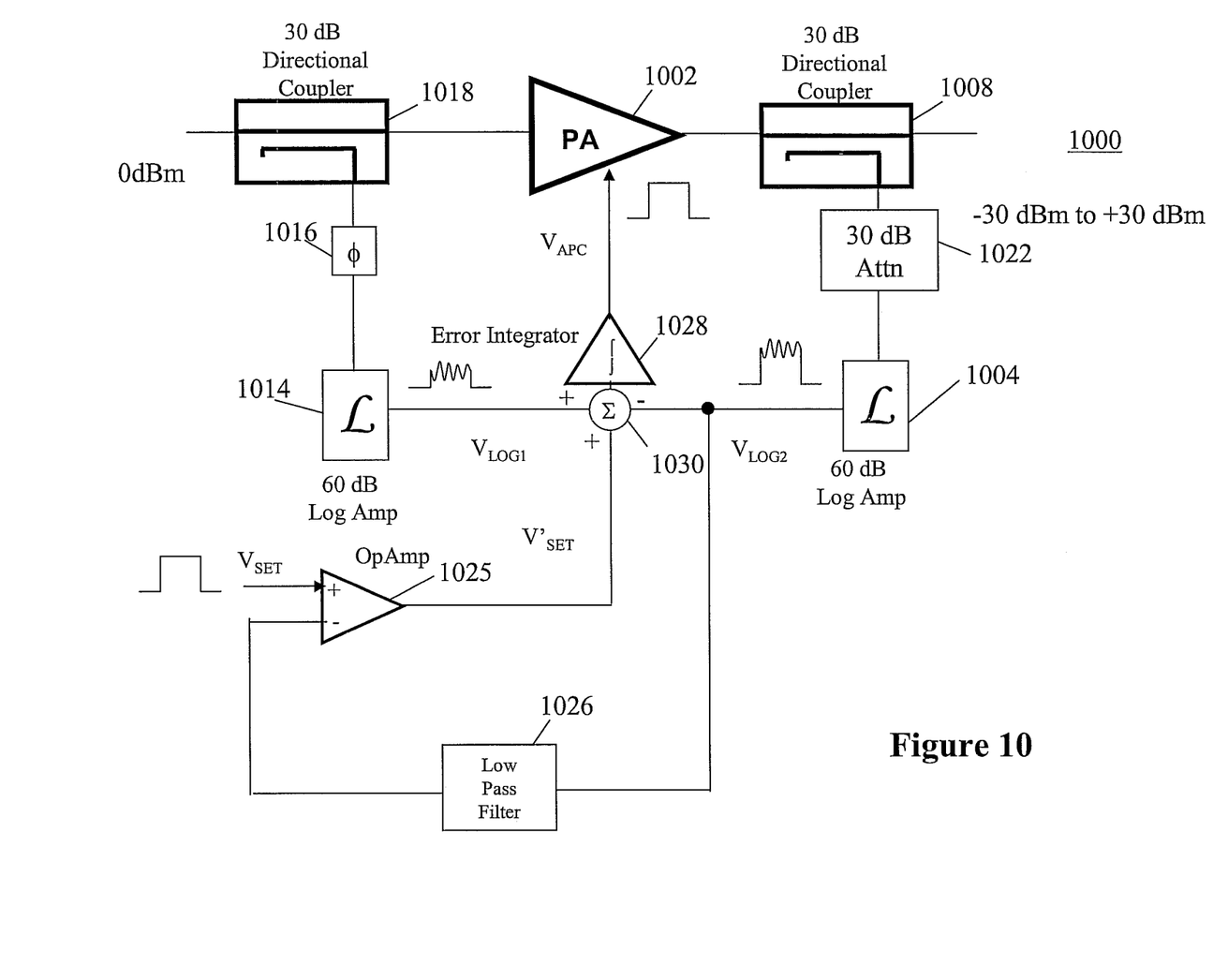
FIG. 10 illustrates another implementation using discrete log-amps.

FIG. 10 illustrates another embodiment using discrete log amps in which power control is provided instead of gain control. This embodiment provides a means for power control without having to AC couple the detected input signal.

For gain control only circuits, if the input power to the PA is well controlled, then the output power will also be well controlled. However, if the input power varies, the output power will also vary. Therefore, it is advantageous to perform power control.

Output power control is achieved by tapping off the signal from output log amp 1004 before it is applied to sum node 1030 and comparing it to the ramp control signal, $V_{set}$, using an operational amplifier 1025. The output of amplifier 1025, when the system is in equilibrium, is equal to the voltage from output log amp 1004 minus the voltage from input log amp 1014. If the output from input log amp 1014 changes, the output of amplifier 1025 will change (changing the gain set point) but the voltage from output log amp 1004 will remain the same, thereby keeping the output power constant.

Some filtering of the signal fed to amplifier 1025 from output log amp 1004 is needed to prevent the op-amp from responding to the fast changes in the envelope of the output signal. Therefore, low pass filter 1026 filters this signal before it is input to amplifier 1025. Filter 1026 introduces a delay in the signal from detector 1004 to op-amp 1025, which causes the initial response of the circuit to set the gain of the amplifier. The second control loop, formed by low pass filter 1026 and op-amp 1025, takes over after a delay proportional to the bandwidth of filter 1026 and corrects the output power level. Filter 1026 is disabled during ramping in order to speed the response of the power control when no AM signal is present and enabled during burst transmission. Therefore, in this implementation, the summing junction comprises operational amplifier 1025, sum node 1030, low pass filter 1026 and error amplifier/integrator 1028.

Figure 11:
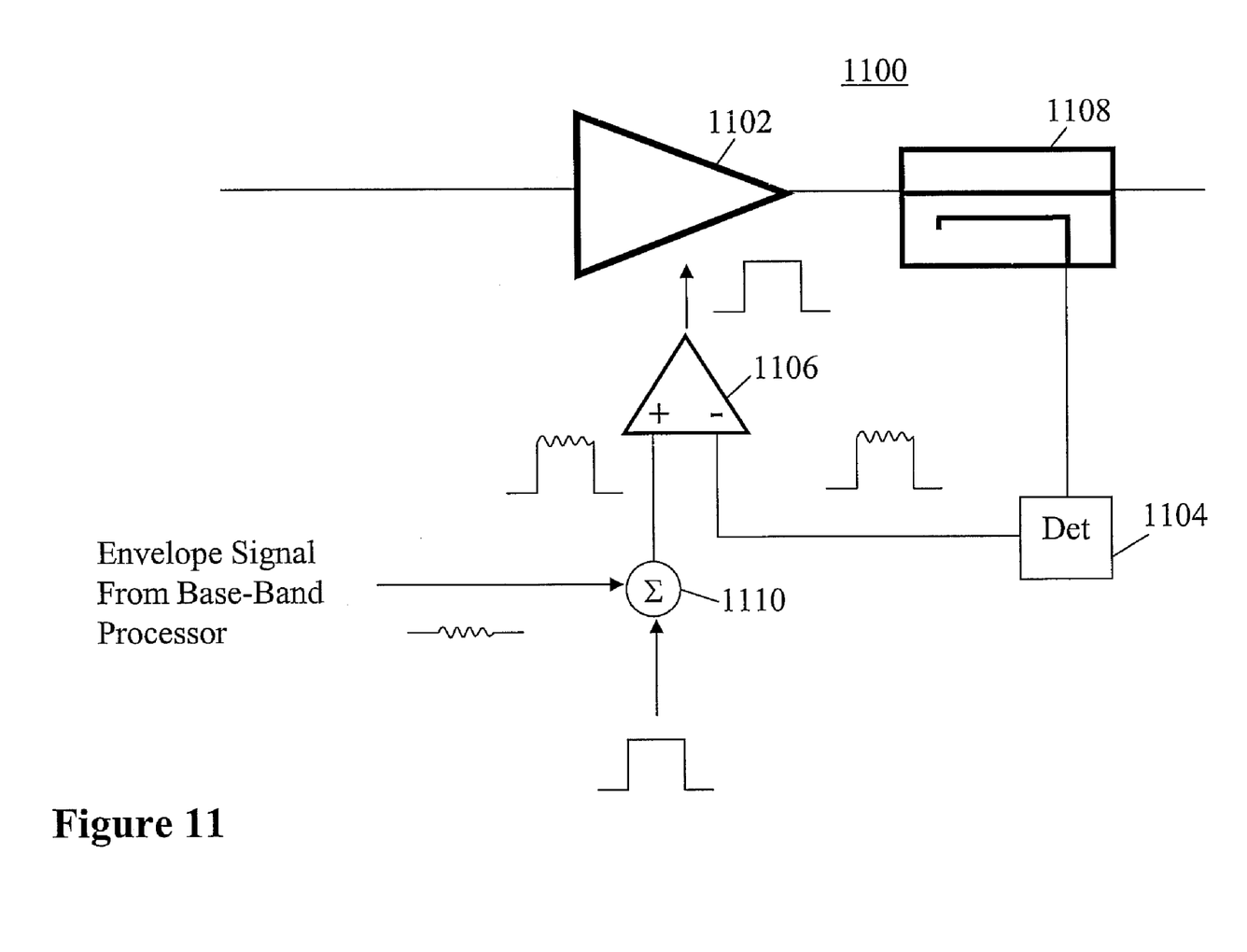
FIG. 11 shows an embodiment of the present invention where the AM variation of the envelope is provided from the base-band processor, which eliminates the need for the input demodulating detector.

In another embodiment of the present invention, the input demodulating detector is eliminated by obtaining a signal representative of the AM variation directly from the base-band signal. A power detector/controller 1100 according to this embodiment is shown in FIG. 11. The AM variation of the signal is provided by the base-band processor in the wireless handset and summed with the ramp control signal at summing node 1110. Otherwise, power detector/controller 1100 operates the same as power controller/detector 600 of FIG. 6. The signal from the base-band processor should be properly conditioned to compare correctly with the output detected signal. That is, if a logarithmic detector is used at the output, then the baseband processor should provide a logarithmic signal, and if a linear detector is used, then the baseband processor should provide a linear signal with the appropriate scaling.

Although the present invention has been shown and described with respect to several preferred embodiments thereof, various changes, omissions and additions to the form and detail thereof, may be made therein, without departing from the spirit and scope of the invention. While some signals have been described as voltages, and others as currents, one of skill in the art would appreciate that the signals described could be either and are not limited to the form described.

What is claimed is:

1. A power detector/controller for wireless handsets that use a modulation scheme having a non-constant amplitude envelope, the power detector/controller comprising:

a power amplifier having an input to receive a input signal with non-constant amplitude envelope and an output to output an amplified input signal, wherein either output power or gain of the power amplifier is controlled by a power amplifier control signal;

an output demodulating detector coupled to the output of the power amplifier to generate a feedback signal proportional to the amplified input signal's power, the feedback signal including an AM variation due to the non-constant amplitude envelope;

a summing junction to receive the feedback signal, a ramp control signal that indicates either a target gain or target output power of the power amplifier, and an AM variation signal that represents the AM variation in the power of the input signal due to the non-constant amplitude envelope; and the summing junction combining the feedback signal, the ramp control signal and AM variation signal to produce the power amplifier control signal such that the power amplifier control signal substantially free of any AM variation due to the non-constant envelope.

2. A power detector/controller for wireless handsets that use a modulation scheme having a non-constant amplitude envelope, as per claim 1, further comprising:
an input demodulating detector coupled to the input of the power amplifier to generate the AM variation signal received by the summing junction.

3. A power detector/controller for wireless handsets that use a modulation scheme having a non-constant amplitude envelope, as per claim 2, wherein the input demodulating detector is coupled to the input via a phase shifter.

4. A power detector/controller for wireless handsets that use a modulation scheme having a non-constant amplitude envelope, as per claim 2, wherein the summing junction comprises:
a variable gain amplifier operatively coupled to the input demodulating detector to receive the AM variation signal and adjust the amplitude of the AM variation signal;
a differential amplifier to receive the feedback signal on a negative input and to receive the ramp control signal on a positive input, the differential amplifier having a filter capacitor connected between the negative input and an output of the differential amplifier, the differential amplifier producing an error signal from the feedback signal and ramp control signal; and
a sum node to receive the AM variation signal from the variable gain amplifier and to receive the error signal, the sum node combining the received AM variation signal and error signal to produce the power amplifier control signal that is substantially free of any AM variation due to the non-constant envelope.

5. A power detector/controller for wireless handsets that use a modulation scheme having a non-constant amplitude envelope, as per claim 4, wherein the variable gain amplifier is operatively coupled to the input demodulating detector via an AC-coupling capacitor that removes any DC component in the AM variation signal.

6. A power detector/controller for wireless handsets that use a modulation scheme having a non-constant amplitude envelope, as per claim 2, wherein the summing junction comprises:
a variable gain amplifier operatively coupled to the input demodulating detector to receive the AM variation signal and adjust the amplitude of the AM variation signal;
a multiplication node to multiply the AM variation signal from the variable gain amplifier with the ramp control signal to produce a composite AM variation/ramp control signal; and
a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

7. A power detector/controller for wireless handsets that use a modulation scheme having a non-constant amplitude envelope, as per claim 6, wherein the variable gain amplifier is operatively coupled to the input demodulating detector via an AC-coupling capacitor that removes any DC component in the AM variation signal.

8. A power detector/controller for wireless handsets that use a modulation scheme having a non-constant amplitude envelope, as per claim 2, wherein the input and output demodulating detectors are logarithmic detectors and the summing junction comprises:
a sum node operatively coupled to the input demodulating detector to add the AM variation signal with the ramp control signal to produce a composite AM variation/ramp control signal; and
a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

9. A power detector/controller for wireless handsets that use a modulation scheme having a non-constant amplitude envelope, as per claim 8, wherein the sum node is operatively coupled to the input demodulating detector via an AC-coupling capacitor that removes any DC component in the AM variation signal.

10. A power detector/controller for wireless handsets that use a modulation scheme having a non-constant amplitude envelope, as per claim 2, wherein the input and output demodulating detectors are logarithmic detectors and the summing junction comprises:
a low pass filter to filter the feedback signal;
an operational amplifier to receive the filtered feedback signal on a negative input and to receive the ramp control signal on a positive input, the differential amplifier producing a gain error signal from the filtered feedback signal and ramp control signal;
a sum node to combine the AM variation signal, the feedback signal from the output demodulating detector, and the gain error signal to produce a combined signal substantially free of any AM variation due to the non-constant envelope; and
an error amplifier/integrator to receive the combined signal and produce the power amplifier control signal substantially free of any AM variation due to the non-constant envelope from the composite signal and ramp control signal.

11. A power detector/controller for wireless handsets that use a modulation scheme having a non-constant amplitude envelope, as per claim 1, wherein the wireless handsets also use a modulation scheme having a constant amplitude envelope.

12. A wireless handset for a mobile communication system that uses a modulation scheme having a non-constant amplitude envelope, the wireless handset comprising:
a power detector/controller to control the power level of output RF bursts, the power detector/controller comprising:
a power amplifier having an input to receive a input signal with non-constant amplitude envelope and an output to output an amplified input signal, wherein either output power or gain of the power amplifier is controlled by a power amplifier control signal;
an output demodulating detector coupled to the output of the power amplifier to generate a feedback signal proportional to the amplified input signal's power, the feedback signal including an AM variation due to the non-constant amplitude envelope;

a summing junction to receive the feedback signal, a ramp control signal that indicates either a target gain or target output power of the power amplifier, and an AM variation signal that represents the AM variation in the power of the input signal due to the non-constant amplitude envelope; and the summing junction combining the feedback signal, the ramp control signal and AM variation signal to produce the power amplifier control signal such that the power, amplifier control signal substantially free of any AM variation due to the non-constant envelope.

13. A wireless handset for a mobile communication system that uses a modulation scheme having a non-constant amplitude envelope, as per claim 12, further comprising:

an input demodulating detector coupled to the input of the power amplifier to generate the AM variation signal received by the summing junction.

14. A wireless handset for a mobile communication system that uses a modulation scheme having a non-constant amplitude envelope, as per claim 13, wherein the input demodulating detector is coupled to the input via a phase shifter.

15. A wireless handset for a mobile communication system that uses a modulation scheme having a non-constant amplitude envelope, as per claim 13, wherein the summing junction comprises:

a variable gain amplifier operatively coupled to the input demodulating detector to receive the AM variation signal and adjust the amplitude of the AM variation signal;

a differential amplifier to receive the feedback signal on a negative input and to receive the ramp control signal on a positive input, the differential amplifier having a filter capacitor connected between the negative input and an output of the differential amplifier, the differential amplifier producing an error signal from the feedback signal and ramp control signal; and a sum node to receive the AM variation signal from the variable gain amplifier and to receive the error signal, the sum node combining the received AM variation signal and error signal to produce the power amplifier control signal that is substantially free of any AM variation due to the non-constant envelope.

16. A wireless handset for a mobile communication system that uses a modulation scheme having a non-constant amplitude envelope, as per claim 15, wherein the variable gain amplifier is operatively coupled to the input demodulating detector via an AC -coupling capacitor that removes any DC component in the AM variation signal.

17. A wireless handset for a mobile communication system that uses a modulation scheme having a non-constant amplitude envelope, as per claim 13, wherein the summing junction comprises:

a variable gain amplifier operatively coupled to the input demodulating detector to receive the AM variation signal and adjust the amplitude of the AM variation signal;

a multiplication node to multiply the AM variation signal from the variable gain amplifier with the ramp control signal to produce a composite AM variation/ramp control signal; and a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

18. A wireless handset for a mobile communication system that uses a modulation scheme having a non-constant amplitude envelope, as per claim 17, wherein the variable gain amplifier is operatively coupled to the input demodulating detector via an AC-coupling capacitor that removes any DC component in the AM variation signal.

19. A wireless handset for a mobile communication system that uses a modulation scheme having a non-constant amplitude envelope, as per claim 13, wherein the input and output demodulating detectors are logarithmic detectors and the summing junction comprises:

a sum node operatively coupled to the input demodulating detector to add the AM variation signal with the ramp control signal to produce a composite AM variation/ramp control signal; and a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

20. A wireless handset for a mobile communication system that uses a modulation scheme having a non-constant amplitude envelope, as per claim 19, wherein the sum node is operatively coupled to the input demodulating detector via an AC-coupling capacitor that removes any DC component in the AM variation signal.

21. A wireless handset for a mobile communication system that uses a modulation scheme having a non-constant amplitude envelope, as per claim 13, wherein the input and output demodulating detectors are logarithmic detectors and the summing junction comprises:

a low pass filter to filter the feedback signal;

a differential amplifier to receive the filtered feedback signal on a negative input and to receive the ramp control signal on a positive input, the differential amplifier producing a gain error signal from the filtered feedback signal and ramp control signal;

a sum node to combine the AM variation signal, the feedback signal from the output demodulating detector, and the gain error signal to produce a combined signal substantially free of any AM variation due to the non-constant envelope; and an error amplifier/integrator to receive the combined signal and produce the power amplifier control signal substantially free of any AM variation due to the non-constant envelope from the composite signal and ramp control signal.

22. A wireless handset for a mobile communication system that uses a modulation scheme having a non-constant amplitude envelope, as per claim 12, wherein a modulation scheme having a constant amplitude envelope is also used.

23. An RF power amplifier module for signals having a modulation scheme with a non-constant amplitude envelope, the RF power amplifier module comprising:

a power amplifier having an input to receive a input signal with non-constant amplitude envelope and an output to output an amplified input signal, wherein either output power or gain of the power amplifier is controlled by a power amplifier control signal;

an output demodulating detector coupled to the output of the power amplifier to generate a feedback signal proportional to the amplified input signal's power, the feedback signal including an AM variation due to the non-constant amplitude envelope;

a summing junction to receive the feedback signal, a ramp control signal that indicates either a target gain or target output power of the power amplifier, and an AM variation signals that represents the AM variation in the power of the input signal due to the non-constant amplitude envelope; and the summing junction combining the feedback signal, the ramp control signal and AM variation signal to produce the power amplifier control signal such that the power amplifier control signal substantially free of any AM variation due to the non-constant envelope.

24. An RF power amplifier module for signals having a modulation scheme with a non-constant amplitude envelope, as per claim 23, further comprising:

an input demodulating detector coupled to the input of the power amplifier to generate the AM variation signal received by the summing junction.

25. An RF power amplifier module for signals having a modulation scheme with a non-constant amplitude envelope, as per claim 24, wherein the input demodulating detector is coupled to the input via a phase shifter.

26. An RF power amplifier module for signals having a modulation scheme with a non-constant amplitude envelope, as per claim 24, wherein the summing junction comprises:

a variable gain amplifier operatively coupled to the input demodulating detector to receive the AM variation signal and adjust the amplitude of the AM variation signal;

a differential amplifier to receive the feedback signal on a negative input and to receive the ramp control signal on a positive input, the differential amplifier having a filter capacitor connected between the negative input and an output of the differential amplifier, the differential amplifier producing an error signal from the feedback signal and ramp control signal; and a sum node to receive the AM variation signal from the variable gain amplifier and to receive the error signal, the sum node combining the received AM variation signal and error signal to produce the power amplifier control signal that is substantially free of any AM variation due to the non-constant envelope.

27. An RF power amplifier module for signals having a modulation scheme with a non-constant amplitude envelope, as per claim 26, wherein the variable gain amplifier is operatively coupled to the input demodulating detector via an AC-coupling capacitor that removes any DC component in the AM variation signal.

28. An RF power amplifier module for signals having a modulation scheme with a non-constant amplitude envelope, as per claim 24, wherein the summing junction comprises:

a variable gain amplifier operatively coupled to the input demodulating detector to receive the AM variation signal and adjust the amplitude of the AM variation signal;

a multiplication node to multiply the AM variation signal from the variable gain amplifier with the ramp control signal to produce a composite AM variation/ramp control signal; and a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

29. An RF power amplifier module for signals having a modulation scheme with a non-constant amplitude envelope, as per claim 28, wherein the variable gain amplifier is operatively coupled to the input demodulating detector via an AC-coupling capacitor that removes any DC component in the AM variation signal.

30. An RF power amplifier module for signals having a modulation scheme with a non-constant amplitude envelope, as per claim 24, wherein the input and output demodulating detectors are logarithmic detectors and the summing junction comprises:

a sum node operatively coupled to the input demodulating detector to add the AM variation signal with the ramp control signal to produce a composite AM variation/ramp control signal; and a differential amplifier to receive the feedback signal on a negative input and to receive the composite signal on a positive input, the differential amplifier having a filter capacitor connected between the negative input and an output of the differential amplifier, the differential amplifier producing the power amplifier control signal that is substantially free of any AM variation due to the non-constant envelope from the composite signal and ramp control signal.

31. An RF power amplifier module for signals having a modulation scheme with a non-constant amplitude envelope, as per claim 30, wherein the sum node is operatively coupled to the input demodulating detector via an AC-coupling capacitor that removes any DC component in the AM variation signal.

32. An RF power amplifier module for signals having a modulation scheme with a non-constant amplitude envelope, as per claim 24, wherein the input and output demodulating detectors are logarithmic detectors and the summing junction comprises:

a low pass filter to filter the feedback signal;

a differential amplifier to receive the filtered feedback signal on a negative input and to receive the ramp control signal on a positive input, the differential amplifier producing a gain error signal from the filtered feedback signal and ramp control signal;

a sum node to combine the AM variation signal, the feedback signal from the output demodulating detector, and the gain error signal to produce a combined signal substantially free of any AM variation due to the non-constant envelope; and an error amplifier/integrator to receive the combined signal and produce the power amplifier control signal substantially free of any AM variation due to the non-constant envelope from the composite signal and ramp control signal.

33. An RF power amplifier module for signals having a modulation scheme with a non-constant amplitude envelope, as per claim 23, wherein a modulation scheme having a constant amplitude envelope is also used.

* * * * *